(12) United States Patent
Leobandung

(10) Patent No.: US 9,653,464 B1
(45) Date of Patent: May 16, 2017

(54) ASYMMETRIC BAND GAP JUNCTIONS IN NARROW BAND GAP MOSFET

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/264,688

(22) Filed: Sep. 14, 2016

(51) Int. Cl.

| H01L 21/84 | (2006.01) |
|---|---|
| H01L 21/8238 | (2006.01) |
| H01L 27/088 | (2006.01) |
| H01L 21/8234 | (2006.01) |
| H01L 21/306 | (2006.01) |
| H01L 21/02 | (2006.01) |
| H01L 29/201 | (2006.01) |
| H01L 29/161 | (2006.01) |
| H01L 29/08 | (2006.01) |
| H01L 29/06 | (2006.01) |
| H01L 29/417 | (2006.01) |

(52) U.S. Cl.
CPC .... *H01L 27/0886* (2013.01); *H01L 21/02543* (2013.01); *H01L 21/02546* (2013.01); *H01L 21/30612* (2013.01); *H01L 21/823418* (2013.01); *H01L 21/823431* (2013.01); *H01L 29/0669* (2013.01); *H01L 29/0847* (2013.01); *H01L 29/161* (2013.01); *H01L 29/201* (2013.01); *H01L 29/41791* (2013.01)

(58) Field of Classification Search
CPC ..... H01L 21/823821; H01L 21/823431; H01L 21/845
See application file for complete search history.

(56) References Cited

U.S. PATENT DOCUMENTS

| 9,508,833 | B1 * | 11/2016 | Leobandung | ..... H01L 21/30604 |
| 9,524,969 | B1 * | 12/2016 | Balakrishnan | .. H01L 21/823821 |
| 9,525,036 | B2 * | 12/2016 | Bae | ........ H01L 21/308 |
| 2015/0255570 | A1 * | 9/2015 | Basu | ................. H01L 29/6681 |
| | | | | 257/352 |

OTHER PUBLICATIONS

Effendi Leobandung, "Asymmetric Band Gap Junctions in Narrow Band Gap MOSFET", U.S. Appl. No. 15/378,680, filed Dec. 14, 2016.
List of IBM Patents or Patent Applications Treated as Related; Date Filed: Sep. 14, 2016, pp. 1-2.

\* cited by examiner

*Primary Examiner* — Cuong Q Nguyen
(74) *Attorney, Agent, or Firm* — Cantor Colburn LLP; Louis Percello

(57) ABSTRACT

A method for forming a semiconductor device, including forming one or more fin structures on a semiconductor substrate, where the fin structure defines source and drain regions. The method includes forming a gate stack, depositing a first contact insulator layer, and applying an etching process to portions of the first insulator layer to form a trench that extends to the source region. The method also includes depositing an epitaxial lower band gap source material into the trench and extending to the source region, depositing a second insulator layer, applying a second etching process to portions of the second insulator layer to form a trench that extends to the source and drain regions, and depositing a metalizing material over the substrate.

10 Claims, 12 Drawing Sheets

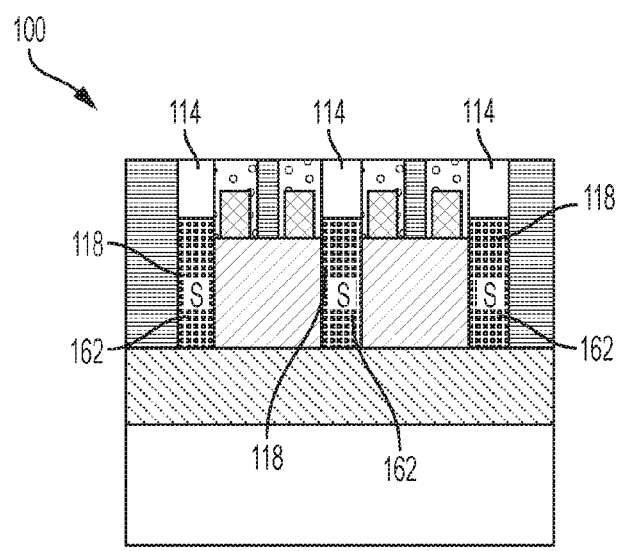
FIG. 6A
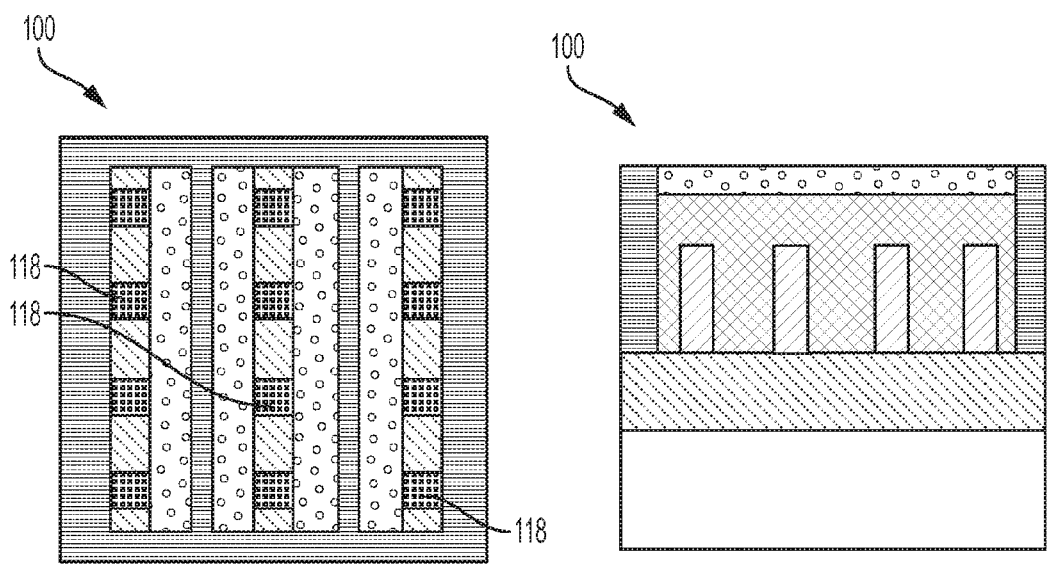
FIG. 6B
FIG. 6C

ASYMMETRIC BAND GAP JUNCTIONS IN NARROW BAND GAP MOSFET

BACKGROUND

The present invention generally relates to metal-oxide-semiconductor field-effect transistors (MOSFET), and more specifically, to providing relatively smaller energy gaps for the source and relatively larger energy gaps for the drain of narrow band gap non-planar MOSFETs.

The MOSFET is a transistor used for amplifying or switching electronic signals. The MOSFET has source, drain, and metal oxide gate junctions or electrodes. As the push to increase the density of transistor devices on a chip continues, non-planar MOSFET structures have been developed, including for example fin-type FETs (FinFETs) and gate-all-around (GAA) nanowire FET structures. In FinFETs, the transistor channel is formed as a vertical fin with the gate wrapped over the fin between the source and drain regions such that the gate is on three sides of the channel. As fin widths decrease, however, channel width variations can cause variability and mobility loss in FinFETs. A GAA FET addresses this variability by placing the gate on all four sides of the channel. A GAA nanowire, for example, is essentially a silicon nanowire with a gate around the nanowire circumference. A GAA nanosheet is a three-dimensional silicon nanosheet with a gate formed around all four sides as well as the surface perpendicular to all four sides. The formation of a replacement GAA nanosheet transistor, like the formation of a replacement gate FinFET, generally involves the formation of a dummy gate used for source and drain formation followed by removal of the dummy gate and replacement with a metal gate.

SUMMARY

A method for forming a semiconductor device, the method including forming a fin structure on a semiconductor substrate, where the fin structure defines a source and drain region. The method also includes forming a gate stack, depositing a contact insulator layer on the substrate, and applying an etching process to remove portions of the insulator layer adjacent to the fin structure to form a trench that extends to the source region. The method continues with depositing an epitaxial lower band gap source material into the trench and extending to the source region, depositing a second insulator layer, applying a second etching process to remove portions of the second insulator layer to form a trench that extends to the source and drain regions, and depositing a metalizing material over the substrate.

A semiconductor device with one or more fin structures formed from a first material, gate, source, and drain regions formed from a second material, and a contact insulator layer deposited over the substrate, where an etching process applied to the substrate removes the insulator to create a trench over the source region. The device also includes a lower band gap source material that is deposited into the trench, a second contact insulator layer, and a metalizing material that is deposited over the substrate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 6A depicts a cross-sectional view of the structure after depositing an epitaxial lower band gap source material into the trenches, according to one or more embodiments of the present invention;

FIG. 6B depicts a top-down view of the semiconductor structure shown in FIG. 6A;

FIG. 6C depicts a cross-sectional view of the semiconductor structure shown in FIG. 6A rotated ninety degrees;

DETAILED DESCRIPTION

Figure 1:
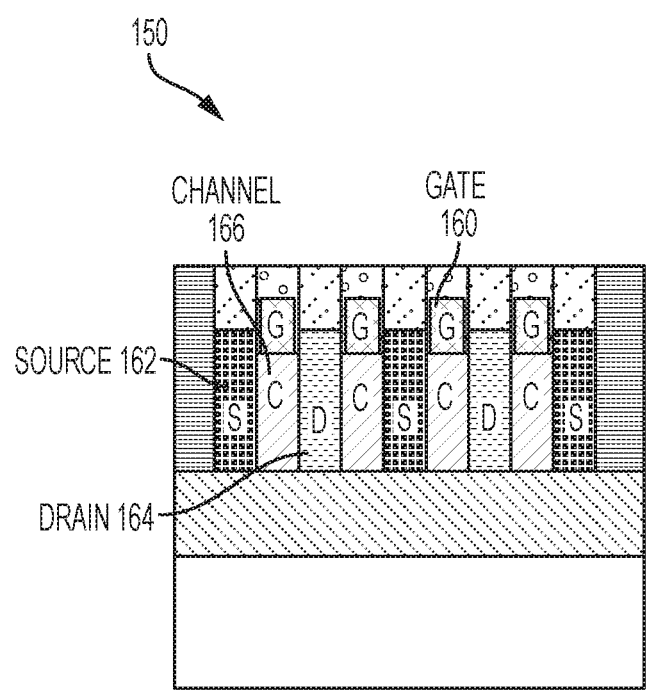
FIG. 1 depicts a cross-sectional view of a semiconductor structure after depositing lower and higher band gap materials onto the structure, according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of specific technologies that are relevant to the present invention, as previously noted herein, the MOSFET is a transistor used for amplifying or switching electronic signals. The MOSFET has source, drain, and metal oxide gate junctions or electrodes. The metal gate is electrically insulated from the main semiconductor n-channel or p-channel by a thin layer of insulating material, for example, silicon dioxide or glass, which makes the input resistance of the MOSFET relatively high. The gate voltage controls whether the path from the drain to the source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

As the push to increase the density of transistor devices on a chip continues, non-planar MOSFET structures have been developed, including for example fin-type FETs (FinFETs) and gate-all-around (GAA) nanowire FET structures. The FinFET is a double-gate or multiple-gate MOSFET device that mitigates the effects of short channels and reduces drain-induced barrier lowering. In FinFETs, the transistor channel is formed as a vertical fin with the gate wrapped over the fin between the source and drain regions such that the gate is on three sides of the channel. As fin widths decrease, however, channel width variations can cause variability and mobility loss in FinFETs. A GAA FET addresses this variability by placing the gate on all four sides of the channel. A GAA nanowire, for example, is essentially a silicon nanowire with a gate around the nanowire circumference. A GAA nanosheet is a three-dimensional silicon structure with a gate formed around all four sides as well as the surface perpendicular to all four sides. The formation of a replacement GAA nanosheet transistor, like the formation of a replacement gate FinFET, generally involves the formation of a dummy gate used for source and drain formation followed by removal of the dummy gate and replacement with a metal gate.

In contemporary semiconductor device fabrication processes, a large number of semiconductor devices, including for example fin-based FETs (e.g., FinFETs, GAA FETs, etc.), are fabricated in and on a single wafer. The semiconductor fins of these devices introduce on-wafer topography. The semiconductor fins are often formed as an array having a periodicity, or fin pitch, to minimize etch bias due to pattern factor, i.e., the fraction of the area of the semiconductor fins within a unit area. In this case, some of the semiconductor fins need to be removed after formation of the array to provide isolated semiconductor fins or a cluster of semiconductor fins isolated from other clusters of fins. The unwanted semiconductor fins are labeled "dummy fins."

The drain current of planar and non-planar MOSFETs can increase when a parasitic current path between the source and drain is present. Typically, the parasitic current path runs below the channel region of the device, and occurs when the source and drain regions of the FET extend too close to each other proximate to the channel region. A consequence of the ongoing efforts to manufacture smaller devices (including providing non-planar FET structures) is a condition where undesirable parasitic current occurs more frequently as the physical dimensions of the source and drain shrink in size. Parasitic currents introduce noise into the device and consume power.

In solid-state physics, a band gap is typically an energy range in a solid where no electron states can exist. In other words, a band gap is the energy difference between the top of the material's valence band and the bottom of the material's conduction band. If the valence band is completely full and the conduction band is completely empty, electrons cannot move in the solid. However, if some electrons transfer from the valence band to the conduction band, current can flow. Therefore, the size of the band gap is a major factor in determining the electrical conductivity of a solid. Substances with large band gaps are generally insulators, and substances with smaller band gaps are semiconductors. Substances that are conductors have either very small band gaps or none.

In the present detailed description, the phrase "lower band gap" is used to describe a semiconductor material that has been processed to provide a smaller energy difference (in electron volts) between the top of the valence band and the bottom of the conduction band in insulators and semiconductors, thus allowing more majority carriers to move. This in turn allows for a greater current flow. Conversely, a "higher band gap" material employs a larger energy difference between the top of the valence band and the bottom of the conduction band, thus hindering majority movement, and restricts current flow.

Embodiments of the present invention provides a device structure that selectively uses lower and higher band gap materials to direct parasitic current flow to a desired junction or electrode where its effects can be minimized. In one or more embodiments of the present invention, the source junction is used as a destination for parasitic currents while the drain junction is designed to be resistant to parasitic current flow. This can be accomplished by depositing lower band gap materials at the source and higher band gap materials at the drain in order to decrease current through the drain and increase current through the source. This has the effect of shunting the majority of parasitic currents through the source junction. In one or more embodiments, unwanted parasitic currents are shunted through the drain. In that case, the higher band gap materials are placed at the source while lower band gap materials are deposited at the drain.

In one or more embodiments of the present invention, undesirable parasitic current is addressed by providing relatively smaller energy gaps for the source and relatively larger energy gaps for the drain of narrow band gap non-planar FETs. The lower and higher band gap materials for the source and drain, respectfully, can be fabricated from indium gallium arsenide (InGaAs) in varying ratios. As one embodiment, one lower band gap material is $In_{0.7}Ga_{0.3}As$, where the concentration of indium (In) is greater than 50% in mass and can approach 100%, according to one or more embodiments of the present invention. At this ratio, $In_{0.7}Ga_{0.3}As$ acts more like a conductor and provides a path for parasitic currents. Also, an embodiment of a higher band gap material is $In_{0.3}Ga_{0.7}As$, where the concentration of indium (In) is less than 50% in mass and can approach 0%, and thus acts like an insulator and hinders parasitic current, according to one or more embodiments of the present invention. By selectively depositing varying ratios of InGaAs onto the structure, the designer can direct unwanted parasitic currents to a desired junction in order to minimize the negative effects of these unwanted currents. The fabrication methodologies and resulting structures according to embodiments of the present invention are described in detail below by referring to the accompanying drawings in FIGS. 1-12C.

To better understand the key concepts described in this invention, refer to FIG. 1, which depicts a cross-sectional view of a semiconductor structure 150 after the processes of depositing lower and higher band gap materials in the source and drain regions, respectfully, are completed. These processes are detailed in FIGS. 2A-12C and include depositing materials to form one or more gate 160, source 162, drain 164, and channel 166 on a semiconductor substrate. Additionally, the gate, channel, source, and drain regions are labeled in the figures "G", "C", "S", and "D" respectfully. In one or more embodiments, the source, gate, drain, and channels are produced in large quantities. In the foregoing discussion, the terms source and sources are interchangeable, as well as channel/channels, drain/drains, and gate/gates. In one or more embodiments, the source 162 is formed from a lower band gap material while the drain 164 is formed from a higher band gap material.

Figure 2A:
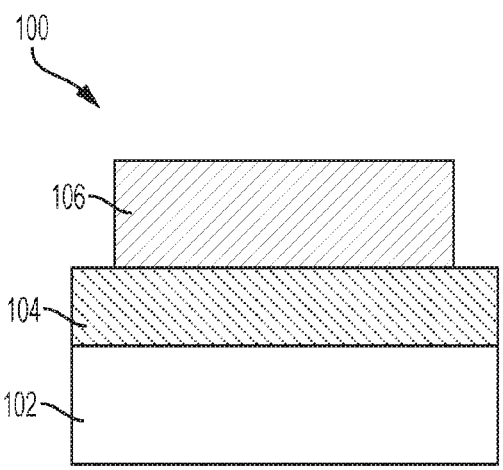
FIG. 2A depicts a cross-sectional view of the semiconductor structure after forming a fin structure on the insulation layer, according to one or more embodiments of the present invention.
Figure 2B:
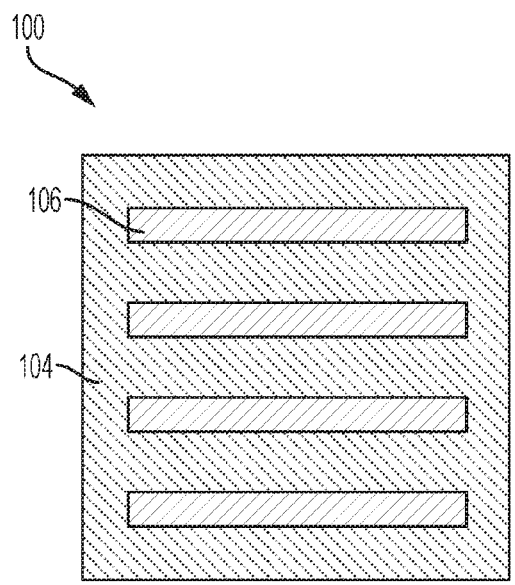
FIG. 2B depicts a top-down view of the semiconductor structure shown in FIG. 2A.
Figure 2C:
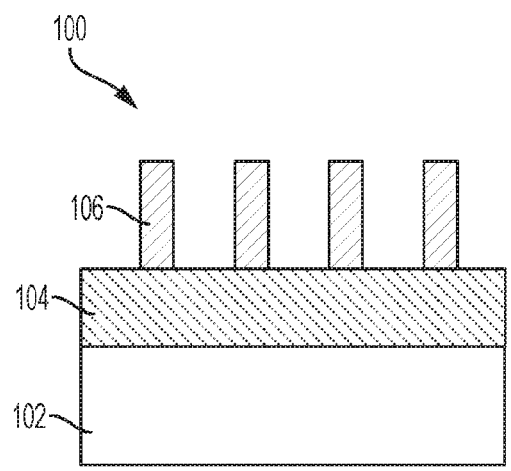
FIG. 2C depicts a cross-sectional view of the semiconductor structure shown in FIG. 2A rotated ninety degrees.

FIG. 2A depicts a cross-sectional view of the semiconductor structure 100 after forming fin structures 106 according to one or more embodiments of the present invention. The structure 100 is formed using an insulation layer 104 that has been deposited on a semiconductor substrate 102 during an intermediate operation of a method of fabricating a semiconductor device, according to one or more embodiments of the present invention. The fabricated semiconductor structure 100, according to one or more embodiments, will be a non-planar FET structure having a so-called gate-all-around (GAA) transistor topology. Suitable materials for the substrate 102 have physical properties that are sufficient to expose to etch processes needed for later deposition and formation, and the subsequent thermal processing (i.e., time and temperature) associated with deposition and etch processes needed for the formation of fins and source and drain deposits. The substrate 102 can be of any suitable substrate material such as, for example, monocrystalline Si, SiGe, SiC, or semiconductor-on-insulator (SOI). In some embodiments, a top layer of the substrate 102 can be Si, SiGe, Group III-V channel material, or other suitable channel materials. Group III-V channel materials include materials having one or more Group III element and one or more Group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including one or more of the foregoing materials. In some embodiments, an insulator or high band gap material 104 such as silicon oxide ($SiO_2$), indium aluminum arsenide (InAlAs), or indium phosphide (InP) is deposited on top of the substrate 102. FIG. 2B depicts a top-down view of the semiconductor structure 100 shown in FIG. 2A. FIG. 2C depicts a cross-sectional view of the semiconductor structure 100 shown in FIG. 2A rotated ninety degrees. Although four fins are depicted in FIG. 2A, more or fewer fins can be provided. For ease of reference, only one of the four fins shown in FIGS. 2A-2C are provided with reference number 106. The fin structure 106 can be made from indium gallium arsenide (InGaAs) or silicon germanium (SiGe). In alternative embodiments, other structures can be used in place of a fin structure, including but not limited to a nanowire, nanosheets, or a planar structure. The fin structure 106 can be formed over substrate 102 and insulation layer 104 using conventional semiconductor device fabrication techniques, including but not limited to aspect ratio trapping (ART) techniques and strain relaxed buffer (SRB) techniques.

Figure 3A:
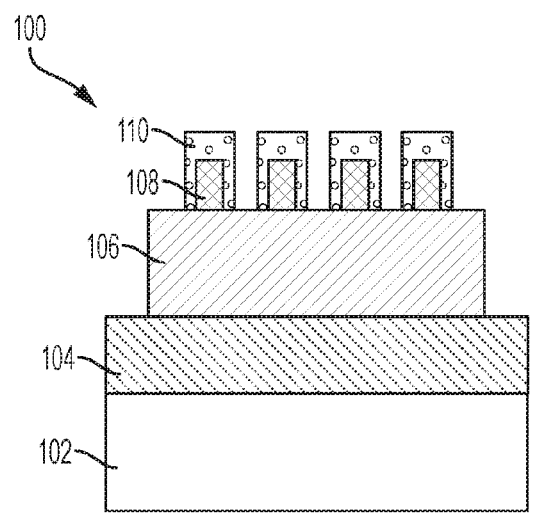
FIG. 3A depicts a cross-sectional view of the structure after forming a gate stack and dielectric spacer on the substrate, according to one or more embodiments of the present invention.
Figure 3B:
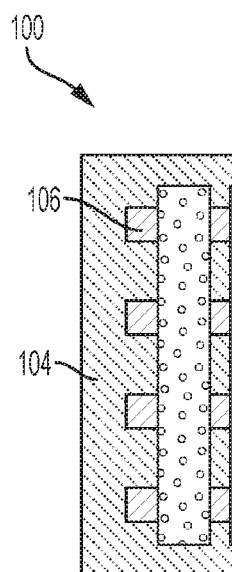
FIG. 3B depicts a top-down view of the semiconductor structure shown in FIG. 3A.
Figure 3C:
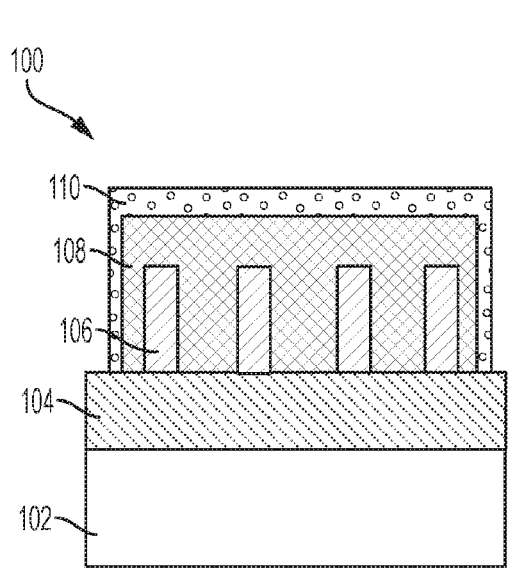
FIG. 3C depicts a cross-sectional view of the semiconductor structure shown in FIG. 3A rotated ninety degrees.

FIG. 3A depicts a cross-sectional view of the structure 100 after forming a gate stack 108 on the structure 100 according to one or more embodiments of the present invention. The gate stack 108 is formed over the insulation layer 104 and the fins 106. Afterwards, a dielectric spacer 110 is deposited on the top and sides of the gate stack 108. The dielectric spacer 110 can be a low-κ (κ=the dielectric constant) dielectric material, which is an improvement over forming the dielectric spacer 110 from a silicon dioxide ($SiO_2$) dielectric that is vulnerable to tunneling effects as the $SiO_2$ dielectric is reduced in thickness. The dielectric spacer 110 can include materials made from boron nitride or silicon boron nitride, and can be deposited using atomic layer deposition. Using a low-κ material in the dielectric spacer 110 allows for reduction in parasitic capacitance without the associated current leakage effects. The dielectric spacer 110 is also deposited in this same process on the sides of the gate stack 108 and is used to further isolate the gate stack 108 from the source 162 and drain 164 of FIG. 1. FIG. 3B depicts a top-down view of the semiconductor structure 100 shown in FIG. 3A. FIG. 3C depicts a cross-sectional view of the semiconductor structure 100 shown in FIG. 3A rotated ninety degrees.

Figure 4A:
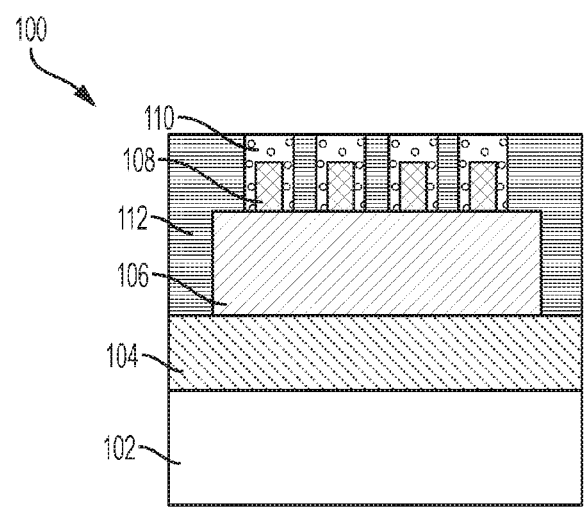
FIG. 4A depicts a cross-sectional view of the structure after depositing a first contact insulator on the substrate, according to one or more embodiments of the present invention.
Figure 4B:
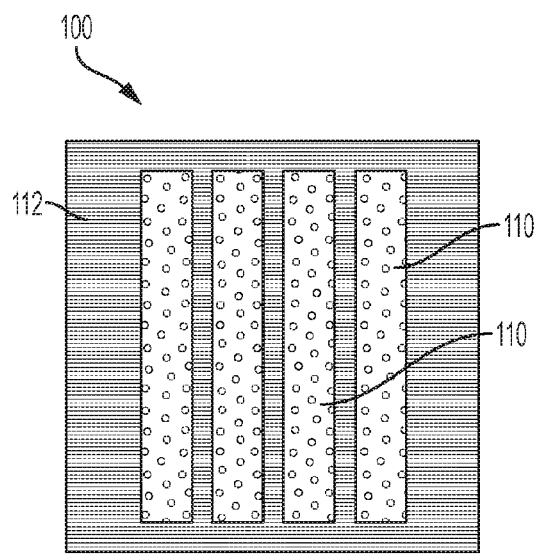
FIG. 4B depicts a top-down view of the semiconductor structure shown in FIG. 4A.
Figure 4C:
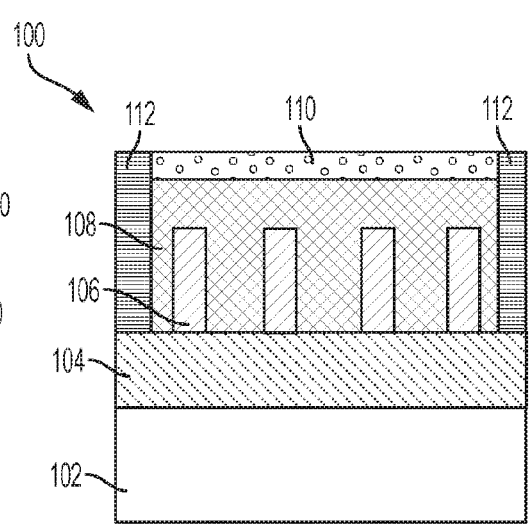
FIG. 4C depicts a cross-sectional view of the semiconductor structure shown in FIG. 4A rotated ninety degrees.

FIG. 4A depicts a cross-sectional view of the structure 100 after conformally depositing a first contact insulator 112 over the structure 100 according to one or more embodiments of the present invention. The first contact insulator 112 can be of any suitable material, such as, for example, an oxide, silicon dioxide, or silicon nitride. The manner of depositing the first contact insulator 112 is not meant to be particularly limited. In some embodiments, the first contact insulator 112 can be conformally formed using chemical vapor deposition (CVD), plasma-enhanced chemical vapor deposition (PECVD), atomic layer deposition (ALD), evaporation, physical vapor deposition (PVD), chemical solution deposition, or other like processes. After conformal deposition, the first contact insulator is polished back using CMP to the level of the dielectric spacer 110. FIG. 4B depicts a top-down view of the semiconductor structure 100 shown in FIG. 4A. FIG. 4C depicts a cross-sectional view of the semiconductor structure 100 shown in FIG. 4A rotated ninety degrees.

Figure 5A:
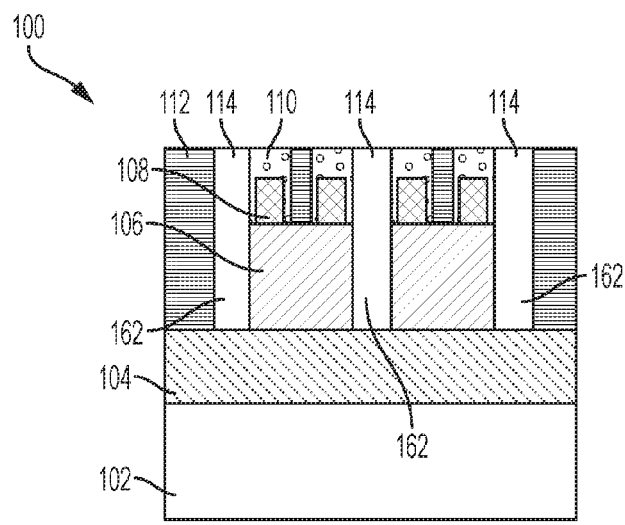
FIG. 5A depicts a cross-sectional view of the structure after etching the first contact insulator layer to the source region on the substrate, according to one or more embodiments of the present invention.
Figure 5B:
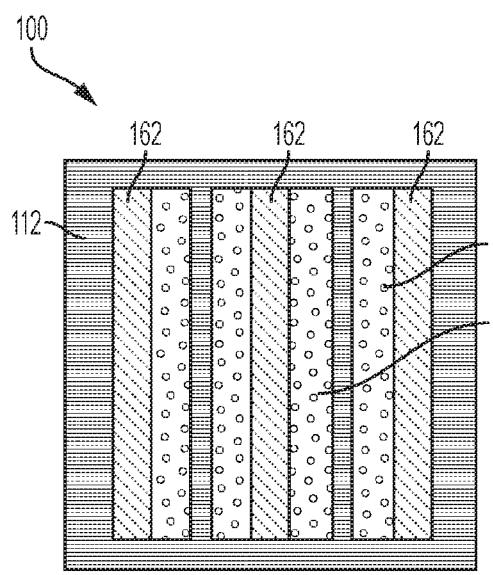
FIG. 5B depicts a top-down view of the semiconductor structure shown in FIG. 5A.
Figure 5C:
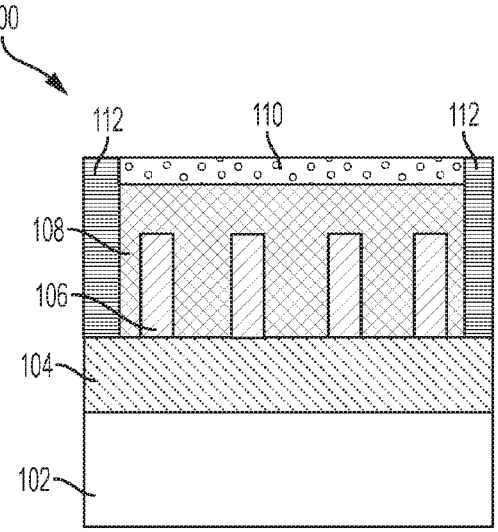
FIG. 5C depicts a cross-sectional view of the semiconductor structure shown in FIG. 5A rotated ninety degrees.

FIG. 5A depicts a cross-sectional view of the structure 100 after applying a photo-resist mask and etching the first contact insulator 112 down to the insulation layer 104 (and the bottom of the source 162) on the structure 100. The etching process creates one or more first trenches 114 in the structure 100 that extend from an upper surface of the dielectric spacer 110 down to the insulator layer 104. The first trenches 114 define areas that correspond to one or more sources 162 according to one or more embodiments of the present invention. FIG. 5B depicts a top-down view of the semiconductor structure 100 shown in FIG. 5A. In FIG. 5B, the sources 162 are seen by viewing the structure 100 through the trenches 114 just etched. FIG. 5C depicts a cross-sectional view of the semiconductor structure 100 shown in FIG. 5A rotated ninety degrees.

FIG. 6A depicts a cross-sectional view of the structure 100 after depositing an epitaxial lower band gap source material 118 into the first trenches 114. The lower band gap material 118 will form the source 162 of the finished FET device, according to embodiments of the present invention. The epitaxial lower band gap source material 118 can be include indium gallium arsenide ($In_{0.7}Ga_{0.3}As$), where the concentration of indium (In) is greater than 50% in mass and can approach 100%, according to one or more embodiments of the present invention. FIG. 6B depicts a top-down view of the semiconductor structure 100 shown in FIG. 6A. FIG. 6C depicts a cross-sectional view of the semiconductor structure 100 shown in FIG. 6A rotated ninety degrees. In a silicon or SiGe channel, the epitaxial lower band gap source material 118 can consist of SiGe where the band gap voltage is lower than found in the channel material.

Figure 7A:
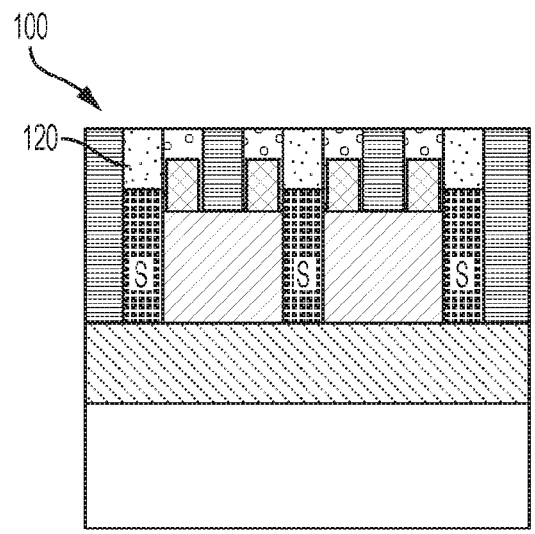
FIG. 7A depicts a cross-sectional view of the structure after depositing a second contact insulator layer on the substrate, according to one or more embodiments of the present invention.
Figure 7B:
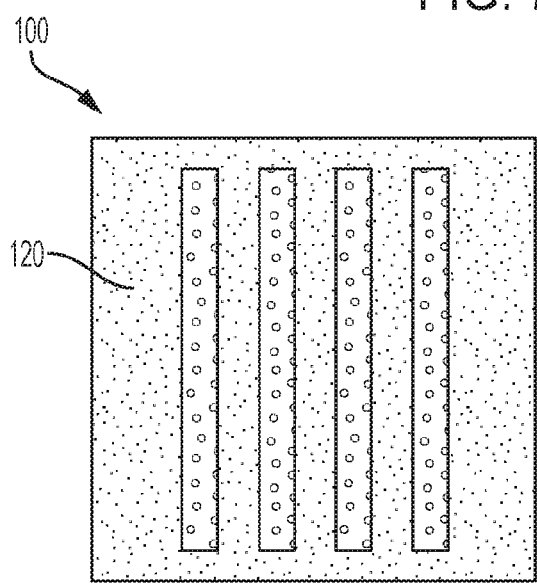
FIG. 7B depicts a top-down view of the semiconductor structure shown in FIG. 7A.
Figure 7C:
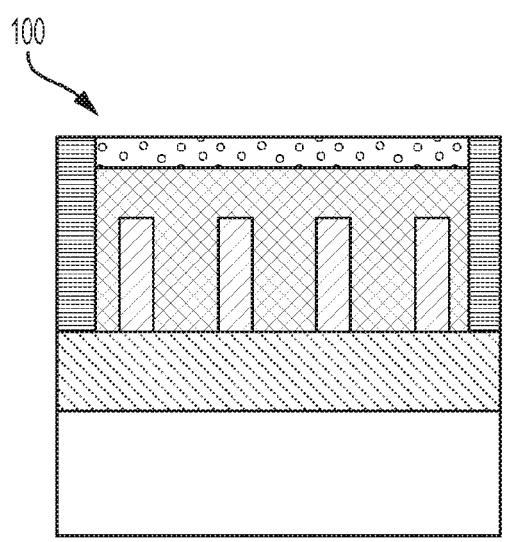
FIG. 7C depicts a cross-sectional view of the semiconductor structure shown in FIG. 7A rotated ninety degrees.

FIG. 7A depicts a cross-sectional view of the structure 100 after depositing a second contact insulator 120 over the structure 100, trenches 114 (of FIG. 6A), and epitaxial lower band gap source material 118 that was deposited as described in FIG. 6A. The second contact insulator 120 can be the same material the first contact insulator 112, or it can be an alternative material. Likewise, the process of applying the second contact insulator 120 can be the same process as described in the description in FIG. 4A. At this stage in the forming process, the semiconductor structure 100 is complete, with the epitaxial lower band gap source material 118 of FIG. 6B deposited into the structure as according to one or more embodiments of the present invention. FIG. 7B depicts a top-down view of the semiconductor structure 100 shown in FIG. 7A. FIG. 7C depicts a cross-sectional view of the semiconductor structure 100 shown in FIG. 7A rotated ninety degrees.

In some embodiments, additional steps can be taken to improve the performance of the semiconductor structure in countering the effects of parasitic currents as described herein. Placing an epitaxial lower band gap source material into the structure to form the source junctions has been previously described herein. Now, an additional embodiment is described where an epitaxial higher band gap drain material is deposited onto the structure to form the drain junctions. Note that the quantity and composition of the lower band gap material as used in the source 162 of FIG. 1 does not need to be the same quantity and type of material as used in the drain 164 of FIG. 1. The two junctions are asymmetric with respect to both type and quantity of materials used.

Figure 8A:
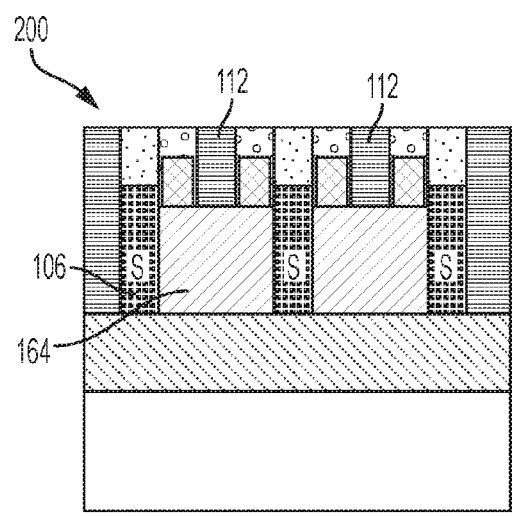
FIG. 8A depicts a cross-sectional view of a semiconductor structure with the epitaxial lower band gap source material deposited on the source regions, according to one or more embodiments of the present invention.
Figure 8B:
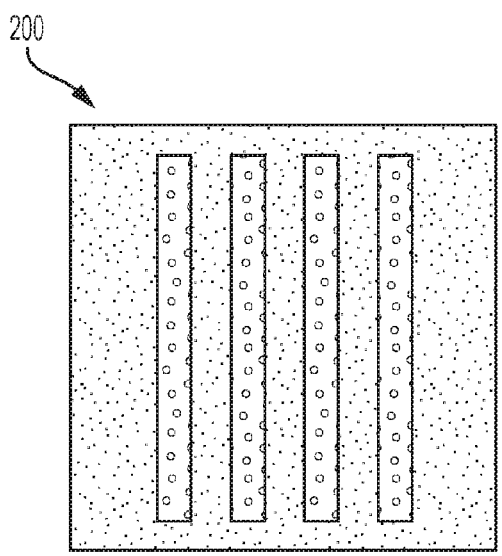
FIG. 8B depicts a top-down view of the semiconductor structure shown in FIG. 8A.
Figure 8C:
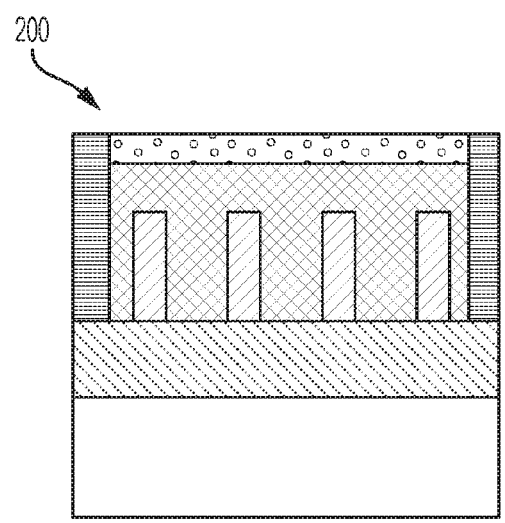
FIG. 8C depicts a cross-sectional view of the semiconductor structure shown in FIG. 8A rotated ninety degrees.

FIG. 8A depicts a cross-sectional view of a semiconductor structure 200 with the epitaxial lower band gap source material 162 already deposited on the sources as described in FIGS. 2-7C. The area of interest includes one or more drains 164 which is covered with the first contact insulator 112 (of FIG. 4A), according to one or more embodiments of the present invention. FIG. 8B depicts a top-down view of the semiconductor structure 200 shown in FIG. 8A. FIG. 8C depicts a cross-sectional view of the semiconductor structure 200 shown in FIG. 8A rotated ninety degrees.

Figure 9A:
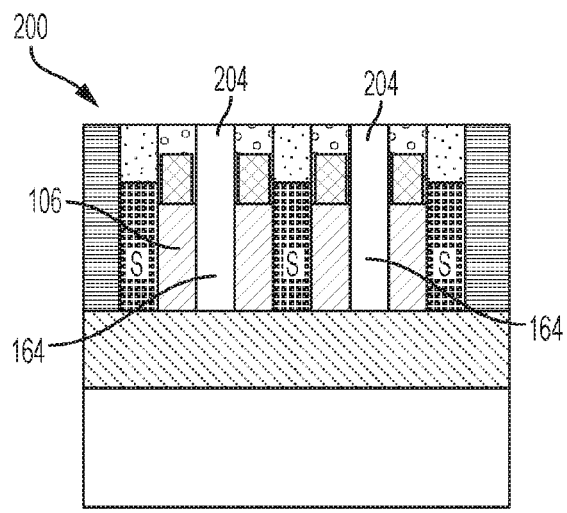
FIG. 9A depicts a cross-sectional view of the structure after etching the second contact insulator layer to form trenches to the drain regions and adjacent to the fin structures, according to one or more embodiments of the present invention.
Figure 9B:
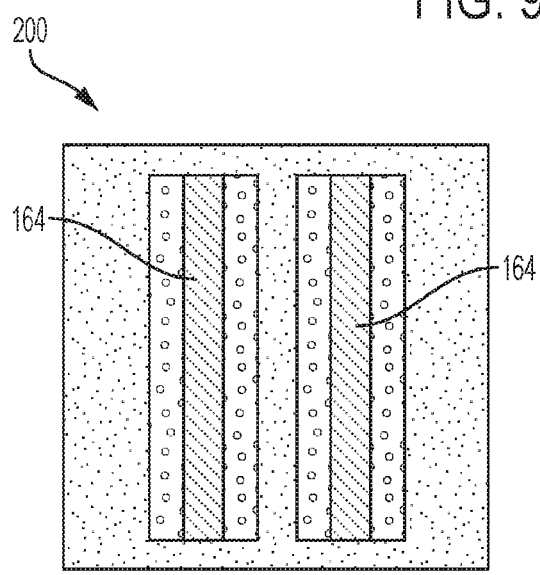
FIG. 9B depicts a top-down view of the semiconductor structure shown in FIG. 9A.
Figure 9C:
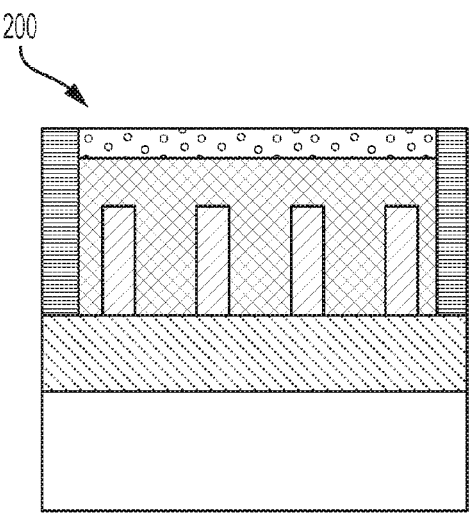
FIG. 9C depicts a cross-sectional view of the semiconductor structure shown in FIG. 9A rotated ninety degrees.

FIG. 9A depicts a cross-sectional view of the structure 200 after etching the first contact insulator 112 (of FIG. 8A) to form one or more second trench or trenches 204 to the drain 164 and adjacent to the fin structures 106 (of FIG. 2A), in a process similar to that described in FIG. 5A, according to one or more embodiments of the present invention. FIG. 9B depicts a top-down view of the semiconductor structure 200 shown in FIG. 9A. FIG. 9C depicts a cross-sectional view of the semiconductor structure 200 shown in FIG. 9A rotated ninety degrees.

Figure 10A:
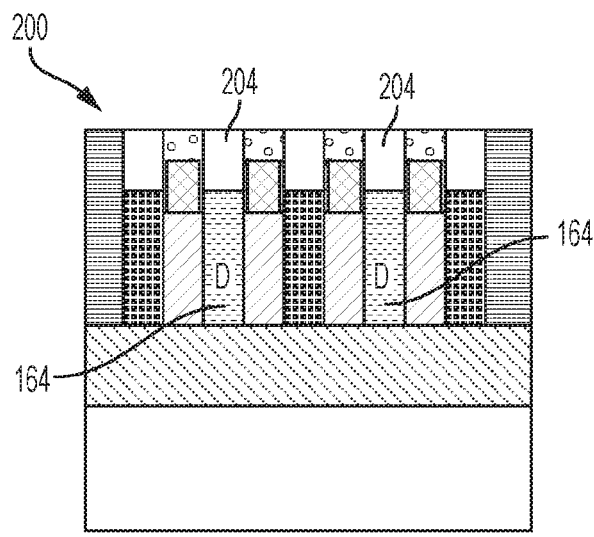
FIG. 10A depicts a cross-sectional view of the structure after depositing an epitaxial higher band gap drain material into the trenches, according to one or more embodiments of the present invention.
Figure 10B:
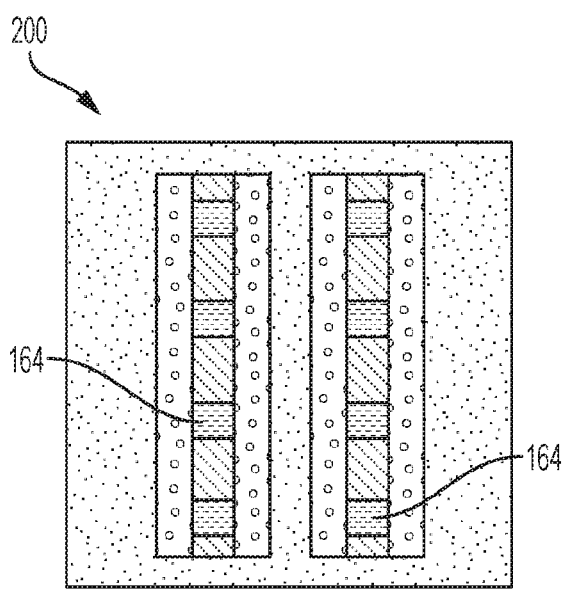
FIG. 10B depicts a top-down view of the semiconductor structure shown in FIG. 10A.
Figure 10C:
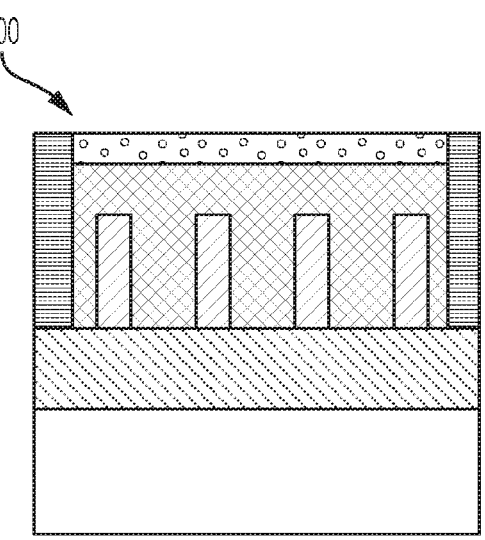
FIG. 10C depicts a cross-sectional view of the semiconductor structure shown in FIG. 10A rotated ninety degrees.

FIG. 10A depicts a cross-sectional view of the structure 200 after depositing an epitaxial higher band gap drain material 206 into the second trench 204. In this figure, the epitaxial higher band gap material 206 is deposited into the second trenches 204 in a process similar to that described in FIG. 6A. The epitaxial higher band source material 206 can be formed from indium gallium arsenide ($In_{0.3}Ga_{0.7}As$), where the concentration of indium (In) is less than 50% in mass and can approach 0%, according to one or more embodiments of the present invention. FIG. 10B depicts a top-down view of the semiconductor structure 200 shown in FIG. 10A. FIG. 10C depicts a cross-sectional view of the semiconductor structure 200 shown in FIG. 10A rotated ninety degrees. In a silicon or SiGe channel, the epitaxial higher band gap material 206 can consist of SiGe where the band gap voltage is higher than found in the channel material.

Figure 11A:
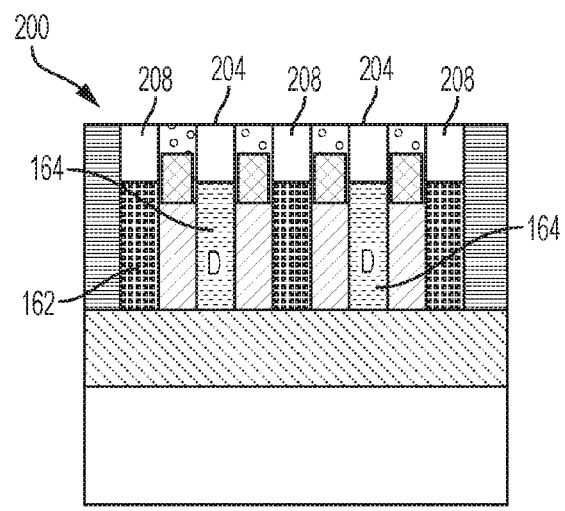
FIG. 11A depicts a cross-sectional view of the structure after etching the contact insulator layer to form trenches to the source regions, according to one or more embodiments of the present invention.
Figure 11B:
FIG. 11B depicts a top-down view of the semiconductor structure shown in FIG. 11A.
Figure 11C:
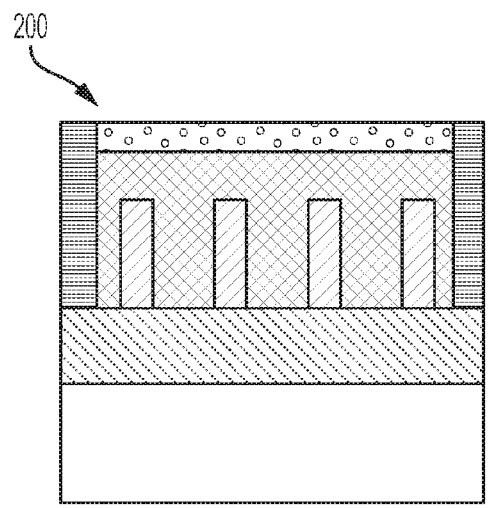
FIG. 11C depicts a cross-sectional view of the semiconductor structure shown in FIG. 11A rotated ninety degrees.

FIG. 11A depicts a cross-sectional view of the structure 200 after etching the second contact insulator 120 (of FIG. 7A) to form a third trench or trenches 208 to the source 162 and drain 164. In FIG. 9A, the process to etch trenches to the drain was discussed. In FIG. 11A, a third etching process is performed to etch one or more third trenches 208 over the source 162 to remove the second contact insulator 120 that was deposited as described in FIG. 7A. At the end of this step, there will be a second trench 204 over the drain 164 and a third trench 208 over the source 162, according to one or more embodiments of the present invention. FIG. 11B depicts a top-down view of the semiconductor structure 200 shown in FIG. 11A. FIG. 11C depicts a cross-sectional view of the semiconductor structure 200 shown in FIG. 11A rotated ninety degrees.

Figure 12A:
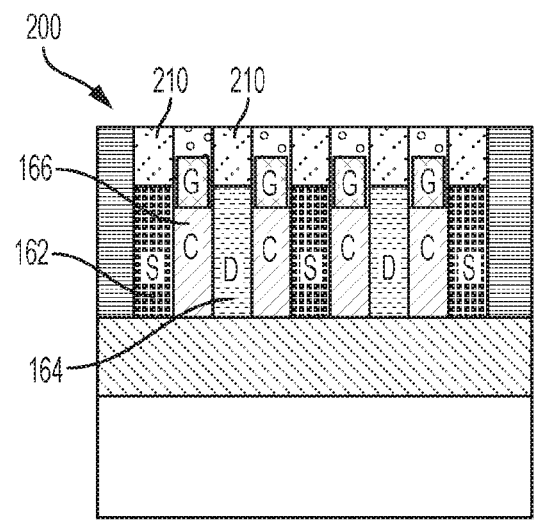
FIG. 12A depicts a cross-sectional view of the structure after depositing a metalizer layer on the substrate, according to one or more embodiments of the present invention.
Figures 12B, 12C:
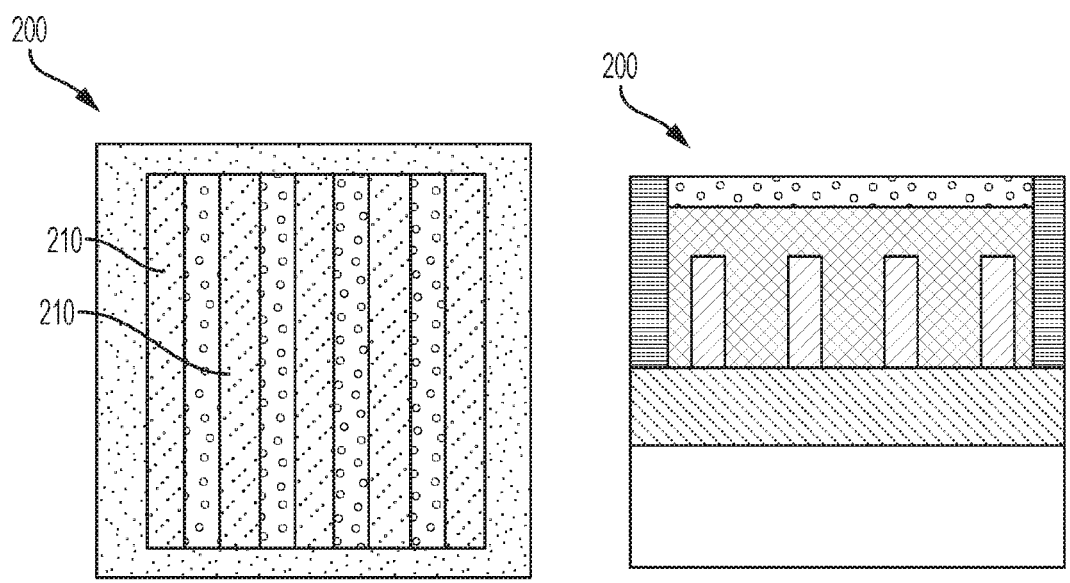
FIG. 12B depicts a top-down view of the semiconductor structure shown in FIG. 12A.
FIG. 12C depicts a cross-sectional view of the semiconductor structure shown in FIG. 12A rotated ninety degrees.

FIG. 12A depicts a cross-sectional view of the structure 200 after depositing a metalizer layer 210 on the structure 200. The metalizer layer 210 will cover the source 162 and drain 164 of the structure 200 and provide an electrical contact for later wire installation. In this embodiment, the structure is complete, with the source 162 formed from $In_xGa_yAs$ (where x<y), the drain 164 formed from $In_xGa_yAs$ (where x>y), and a channel 166 between the source 162 and drain 164 formed from $In_xGa_yAs$ (where x≈y), according to one or more embodiments of the present invention. FIG. 12B depicts a top-down view of the semiconductor structure 200 shown in FIG. 12A. FIG. 12C depicts a cross-sectional view of the semiconductor structure 200 shown in FIG. 12A rotated ninety degrees.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The present invention has been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method for forming a semiconductor device, the method comprising:
   forming one or more fin structures on a semiconductor substrate, wherein the fin structure defines a source and drain region;
   forming a gate stack in contact with the fin structure;
   depositing a first contact insulator layer on the substrate;
   applying a first etching process to remove exposed portions of the first contact insulator layer, adjacent to the fin structure, to form a trench in the first contact insulator layer that extends to the source region;
   depositing an epitaxial lower band gap source material into the trench and extending to the source region;
   depositing a second contact insulator layer on the substrate;
   applying a second etching process to remove exposed portions of the second insulator layer, adjacent to the fin structure, to form a trench in the second contact insulator layer that extends to the source and drain regions; and
   depositing a metalizing material over the substrate.

2. The method of claim 1, wherein the first contact insulator layer is comprised of indium aluminum arsenide (InAlAs) or indium phosphide (InP).

3. The method of claim 1, wherein the second contact insulator layer is comprised of indium aluminum arsenide (InAlAs) or indium phosphide (InP).

4. The method of claim 1, wherein the fin structure is comprised of indium gallium arsenide (InGaAs) or silicon germanium (SiGe).

5. The method of claim 1, wherein the lower band gap source material is comprised of indium gallium arsenide (InGaAs) with an indium concentration of at least 50%.

6. The method of claim 1, wherein the fin structure is instead a nanowire, a nanosheet, or a planar device.

7. The method of claim 1, wherein the fin structure is formed by Aspect Ratio Trapping (ART) or Strain Relaxed Buffer (SRB) processes.

8. The method of claim 1, further comprising planarizing the substrate after depositing the first and/or second contact insulator layers.

9. The method of claim 1, further comprising:
   applying a third etching process to the substrate, wherein the third etching process removes exposed portions of the first contact insulator layer adjacent to the fin structure to form a trench in the first and/or second contact insulator layers to the drain region; and
   depositing an epitaxial higher band gap drain material into the trench and extending to the drain region.

10. The method of claim 9, wherein the higher band gap drain material is comprised of indium gallium arsenide (InGaAs) with an indium concentration less than 50%.

* * * * *